United States Patent
Tseng

[11] Patent Number: 5,804,481
[45] Date of Patent: Sep. 8, 1998

[54] INCREASED CAPACITOR SURFACE AREA VIA USE OF AN OXIDE FORMATION AND REMOVAL PROCEDURE

[75] Inventor: Horng-Huei Tseng, Hsinchu, Taiwan

[73] Assignee: Vanguard International Semiconductor Corporation, Hsin-Chu, Taiwan

[21] Appl. No.: 814,138

[22] Filed: Mar. 10, 1997

[51] Int. Cl.[6] .............................................. H01L 21/8242
[52] U.S. Cl. ........................ 438/255; 438/239; 438/253; 438/665; 438/964
[58] Field of Search ................................... 438/229, 240, 438/253, 254, 255, 386, 396, 397, 398, 665, 702, 766, 964; 148/DIG. 14

[56] References Cited

U.S. PATENT DOCUMENTS

| | | | |
|---|---|---|---|
| 5,254,503 | 10/1993 | Kenney | 437/228 |
| 5,256,587 | 10/1993 | Jun et al. | 437/52 |
| 5,290,729 | 3/1994 | Hayashide et al. | 437/60 |
| 5,447,882 | 9/1995 | Kim | 437/60 |
| 5,464,791 | 11/1995 | Hirota | 438/396 |
| 5,492,848 | 2/1996 | Lur et al. | 437/52 |
| 5,759,894 | 6/1998 | Tseng et al. | 438/255 |

*Primary Examiner*—Charles L. Bowers, Jr.
*Attorney, Agent, or Firm*—George O. Saile; Stephen B. Ackerman

[57] ABSTRACT

A method of creating an STC structure, used for high density, DRAM designs, has been developed. The process consists of creating a saw-toothed topography for the top surface of a polysilicon storage node electrode. The saw-toothed topography is obtained by placing intrinsic HSG polysilicon spots on an underlying doped polysilicon layer. Thermal oxidation creates thick silicon oxide regions in areas of exposed doped polysilicon, while thinner silicon oxide regions form in areas in which the intrinsic HSG polysilicon spots are oxidized. Removal of both thick and thinner silicon oxide regions, creates the saw-toothed topography in the polysilicon storage node electrode, resulting in surface area, and capacitance increases.

21 Claims, 4 Drawing Sheets

INCREASED CAPACITOR SURFACE AREA VIA USE OF AN OXIDE FORMATION AND REMOVAL PROCEDURE

BACKGROUND OF THE INVENTION (1) Field of the Invention

The present invention relates to a method used to fabricate high density, semiconductor, DRAM cells, and more specifically to a process used to increase the surface area, and the accompanying capacitance of an STC component of the DRAM cell, via the use of a storage node electrode configuration, obtained via a novel semiconductor processing sequence.

(2) Description of the Prior Art

The semiconductor industry is continually striving to improve device performance, while still focusing on methods of reducing manufacturing costs. These objectives have been successfully addressed by the ability of the semiconductor industry to produce chips with sub-micron features, or micro-miniaturization. Sub-micron features allow the reduction in performance degrading capacitances and resistances to be realized. In addition the smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller, or sub-micron features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 16 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grained, (HSG), polysilicon layers. Hayashide, in U.S. Pat. No. 5,290,729, describes a storage node, or lower electrode, of an STC structure, in which the surface area of the lower electrode is increased via growth of HSG polysilicon, on the top surface of the lower electrode. However the HSG polysilicon process can be difficult to control, based on the narrow range of deposition and anneal conditions, needed to obtain the desired HSG characteristics. Another method used for achieving the desired electrode surface area is the creation of the lower electrodes with pillars, or protruding shapes of polysilicon, thus resulting in a greater electrode surface area then would have been achieved with conventional flat surfaces. Kim, in U.S. Pat. No. 5,447,882, describes such an STC structure, comprised of a lower electrode, formed by creating protruding polysilicon features, via patterning of a polysilicon layer. However for the Kim invention, the protruding polysilicon shapes, of the lower electrode, are limited by the thickness of the polysilicon layer, thus limiting the resulting increase in capacitance.

This invention will describe a process for increasing the surface area of a polysilicon storage node electrode, by creating a top surface topography, comprised of a pattern of raised and lowered features in the polysilicon storage node. This saw-toothed topography is obtained via initially forming small diameter spots of intrinsic, hemi-spherical grained, (HSG), polysilicon, with the HSG spots discontinuous and overlying a heavily doped polysilicon layer. Subsequent oxidation, results in complete oxidation of the small diameter HSG spots, while a silicon oxide layer, thicker then the silicon oxide formed from the HSG polysilicon spots, forms in the heavily doped polysilicon layer, in regions between the small diameter HSG spots. Removal of all silicon oxide layers result in a polysilicon storage node electrode, with a saw-toothed topography comprised of raised features, in areas in which HSG polysilicon spots were oxidized, followed by removal of the silicon oxide regions, and lower regions, regions in which the heavily doped polysilicon layer, between HSG polysilicon spots, were oxidized, followed by silicon oxide removal. This process, unlike Hayashide, (U.S. Pat. No. 5,290,729), does not rely on HSG polysilicon for increases in topography. The HSG spots are only used to form a discontinuous polysilicon layer, with a doping level lower then an underlying heavily doped polysilicon layer. In addition this invention offers advantages over Kim, (U.S. Pat. No. 5,447,882), in that the height of the polysilicon protrusions, is a result of controllable oxidation processes.

SUMMARY OF THE INVENTION

It is an object of this invention to create a DRAM device, with an STC structure, in which the surface area of the storage node electrode, of the STC structure is increased, without increasing the width of the STC structure.

It is another object of this invention to increase the surface area of a polysilicon storage node electrode, of the STC structure, by creating a saw-toothed topography in the top surface of a polysilicon storage node electrode.

It is yet another object of this invention to create the saw-toothed topography, for the top surface of the polysilicon storage node electrode, by growing thick regions of silicon oxide, in a heavily doped polysilicon layer, between small diameter HSG spots, and thin regions of silicon oxide from the small diameter, intrinsic HSG spots, followed by removal of both thin and thick silicon oxide regions, resulting in the saw-toothed, surface topography for the polysilicon storage node electrode.

In accordance with the present invention a method for fabricating increased capacitance DRAM devices, via use of an STC structure, comprised of a polysilicon storage node electrode with increased surface area, has been developed. Transfer gate transistors comprised of: a thin gate insulator; a polysilicon gate structure, formed from a first polysilicon layer; lightly doped source and drain regions; insulator spacers on the sidewalls of the polysilicon gate structure; and heavily doped source and drain regions; are formed on a semiconductor substrate. A composite insulator layer, comprised of a thin underlying silicon oxide layer, and a thick, overlying, doped oxide layer, is deposited, planarized, then followed by a contact hole opening in the composite insulator layer, made to expose the source and drain regions of adjacent transfer gate transistors. A second polysilicon layer is deposited, heavily doped via use of in situ doping procedures, completely filling the contact hole opening, and contacting the source and drain regions of the transfer gate transistor. The second polysilicon layer also overlies the composite insulator layer, in regions outside the contact hole opening. Thin, small diameter spots of intrinsic HSG polysilicon are next deposited on the underlying, heavily doped, second polysilicon layer. Thermal oxidation is performed to convert the entire thickness of the intrinsic, small diameter HSG spots to a first silicon oxide, while a second silicon oxide region, thicker then the first silicon oxide formed from oxidation of intrinsic HSG spots, is created in the heavily doped polysilicon layer, exposed between the intrinsic, small diameter HSG spots. Removal of both silicon oxide regions results in a saw-toothed topography for the top surface of the second polysilicon layer comprised of low regions, regions in which thick silicon oxide had been formed and removed, and high regions, regions in which oxidized HSG spots, had formed and were removed. Photolithographic and dry etching procedures, are then used to create the bottom electrode, or polysilicon storage node electrode shape, in the second polysilicon layer. A capacitor dielectric layer is next formed on the polysilicon storage node electrode structure, followed by the creation of an upper polysilicon electrode, or plate electrode structure, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a polysilicon storage node electrode, with increased surface area resulting from a saw-toothed topography, will now be described. The transfer gate transistor, used for this DRAM device, in this invention, will be an N channel device. However the STC structure, with the increased surface area described in this invention, can also be applied to P channel, transfer gate transistor.

Figure 1:
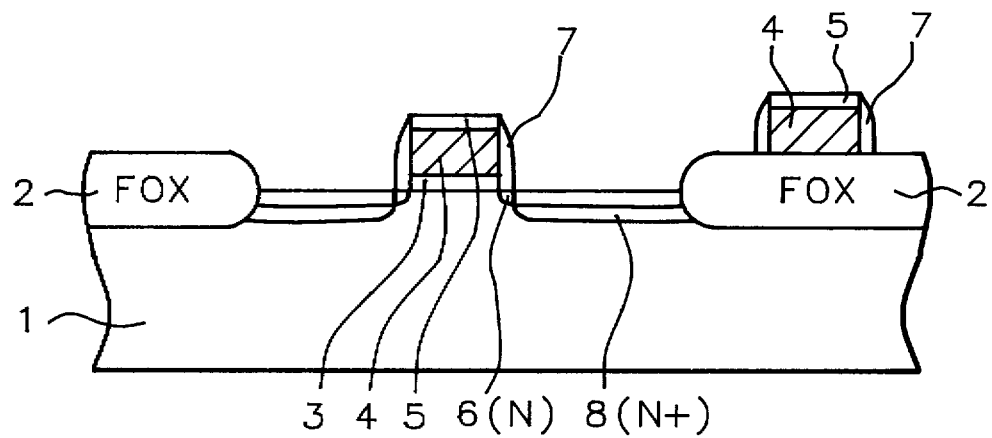
FIGS. 1–7, which schematically shows, in cross-sectional style, the key fabrication stages used in the creation of a DRAM device, with a STC structure, with an increased surface area, resulting from a polysilicon storage node electrode structure, featuring a saw-toothed topography.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A first polysilicon layer, 4, is next deposited using low pressure chemical vapor deposition, (LPCVD), procedures, at a temperature between about 500° to 700° C., to a thickness between about 1500 to 4000 Angstroms. The polysilicon can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A first silicon oxide layer, 5, used as a cap insulator layer, is next grown via the use of either LPCVD or plasma enhanced chemical vapor deposition, (PECVD), procedures, to a thickness between about 600 to 1500 Angstroms. Conventional photolithographic and reactive ion etching, (RIE), procedures, using $CHF_3$ as an etchant for silicon oxide layer, 5, and using $Cl_2$ as an etchant for polysilicon layer, 4, are used to create polysilicon gate structures, 4, with overlying cap insulator layer, 5, shown schematically in FIG. 1. Photoresist removal is accomplished via plasma oxygen ashing and careful wet cleans.

A lightly doped source and drain region, 6, is next formed via ion implantation of phosphorous, at an energy between about 20 to 50 KeV, at a dose between about 1E13 to 1E14 atoms/cm$^2$. A second insulator layer of silicon oxide is then deposited using either LPCVD or PECVD procedures, at a temperature between about 400° to 700°C., to a thickness between about 1500 to 4000 Angstroms, followed by an anisotropic RIE procedure, using $CHF_3$ as an etchant, creating insulator spacer, 7, on the sidewalls of polysilicon gate structures, 4. A heavily doped source and drain region, 8, is then formed via ion implantation of arsenic, at an energy between about 30 to 100 KeV, at a dose between about 1E14 to 5E16 atoms/cm$^2$. The result of these procedures are schematically shown in FIG. 1.

Figure 2:
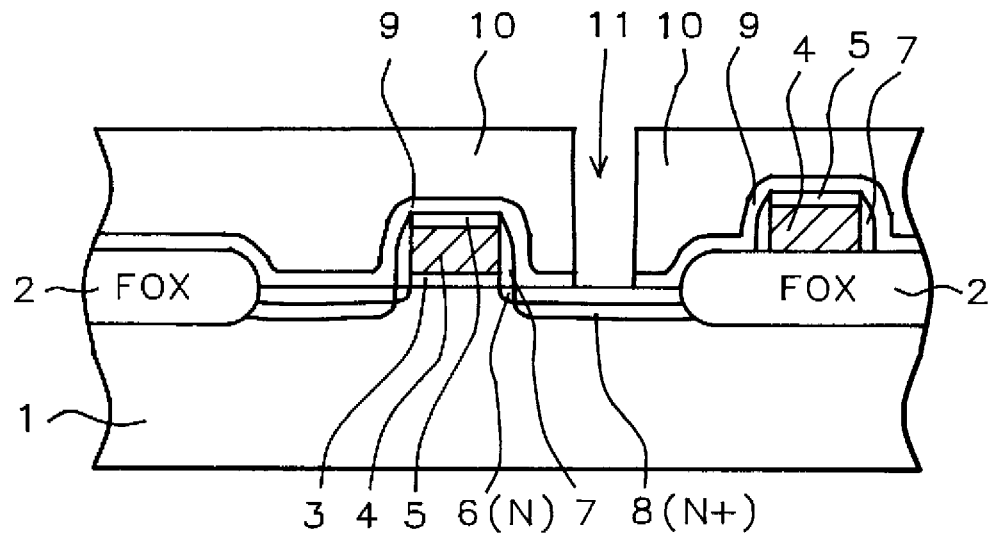

A third insulator layer of undoped silicon oxide, 9, is next deposited using LPCVD or PECVD procedures, at a temperature between about 700° to 800° C., to a thickness between about 1000 to 1500 Angstroms. A layer of doped silicon oxide, 10, either boro-phosphosilicate glass, (BPSG), or phosphosilicate glass, (PSG), is next deposited, using PECVD procedures, at a temperature between about 700° to 800° C., to a thickness between about 3000 to 6000 Angstroms, using tetraethylorthosilicate, (TEOS) as a source with the addition of either diborane and phosphine, for the BPSG layer, or the addition of only phosphine, for the PSG layer. (Another iteration is the use of a single doped oxide or a single undoped oxide layer, replacing dual layered composite). Doped oxide layer, 10, is planarized using chemical mechanical polishing, to provide a smoother surface for subsequent depositions and patterning procedures. The result of these depositions and planarization procedures are schematically shown in FIG. 2. Conventional photolithographic and RIE procedures, using $CHF_3$ as an etchant, are used to open contact hole, 11, in doped silicon oxide layer 10, and in silicon oxide layer, 9, exposing the top surface of heavily doped source and drain region, 8, again shown schematically in FIG. 2. Photoresist removal is performed via use of plasma oxygen ashing and careful wet cleans.

Figure 3:
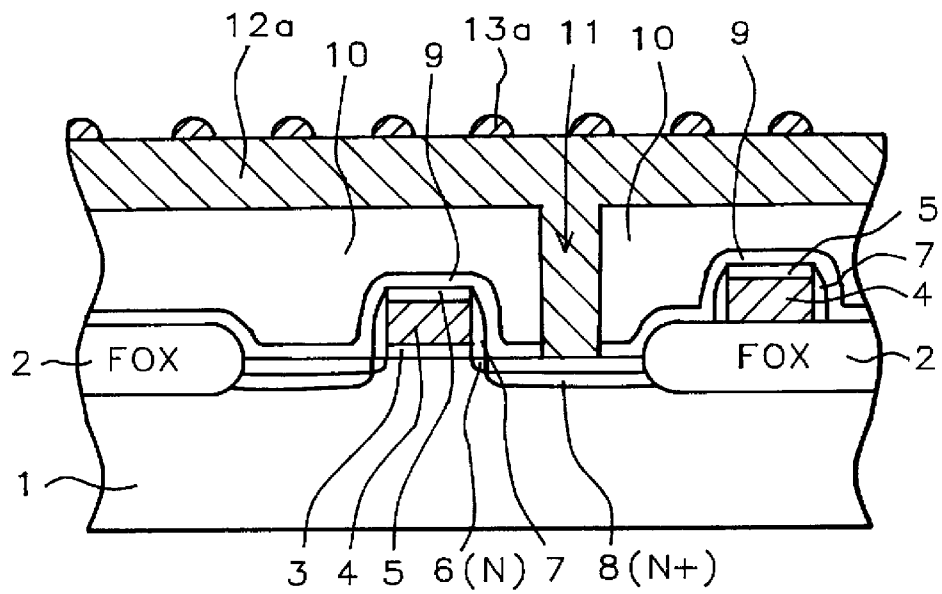

A second layer of polysilicon layer, 12a, is next deposited, via LPCVD procedures, at a temperature between about 500° to 700° C., to a thickness between about 1000 to 4000 Angstroms. Polysilicon layer, 12a, can be deposited intrinsically and doped via ion implantation of either phosphorous or arsenic, or polysilicon layer, 12a, can be deposited using in situ doping procedures, via the addition of either phosphine or arsine, to a silane ambient. For both doping procedures polysilicon layer, 12a, has an N type doping concentration of between 1E20 to 1E21 atoms/cm$^3$. Polysilicon layer, 12a, shown schematically in FIG. 3, completely fills contact hole, 11, contacting underlying heavily doped source and drain regions, 8, of the underlying transfer gate transistor. A critical deposition of intrinsic, hemispherical grained, (HSG), polysilicon, 13a, is next deposited at a temperature between about 500° to 700° C., to a thickness in which the intrinsic HSG polysilicon is discontinuous, resulting in intrinsic HSG polysilicon spots, 13a, between about 100 to 1000 Angstroms in thickness, with a diameter between about 50 to 500 Angstroms, and with a space between intrinsic HSG polysilicon spots, 13a, between about 100 to 1000 Angstroms. This is schematically shown in FIG. 3.

Figure 4:
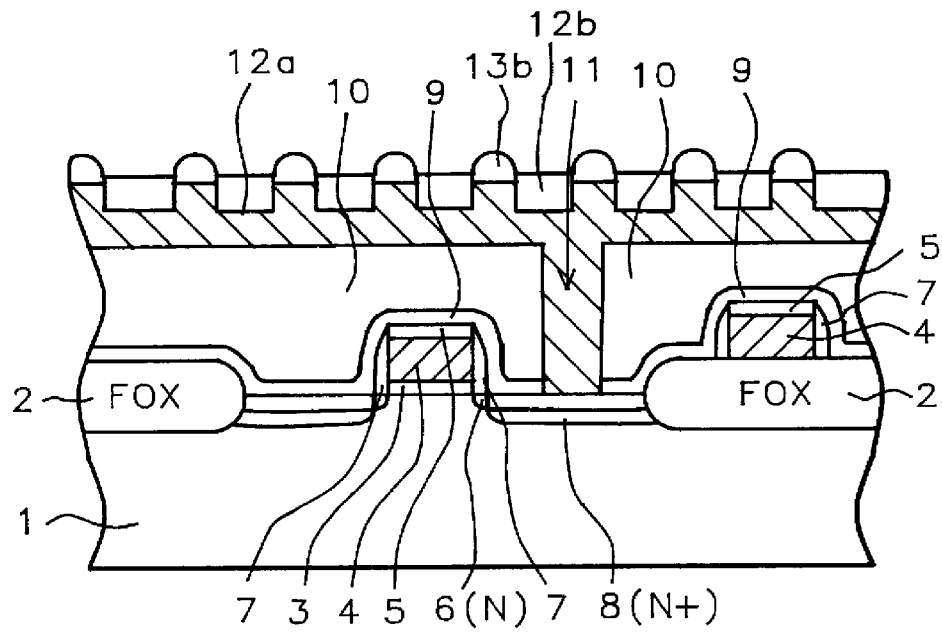

A thermal oxidation is next performed, in an oxygen-steam ambient, at a temperature between about 700° to 900° C., for a amount of time needed to convert the entire thickness of intrinsic HSG polysilicon spots, 13a, to a first silicon oxide region, 13b, between about 200 to 1000 Angstroms in thickness. The same oxidation procedure also converts regions of doped polysilicon layer, 12a, to a second silicon oxide region, 12b, between about 300 to 2000 Angstroms in thickness. Because of the increased oxidation rate of doped polysilicon, 12a, when compared to the oxidation rate of intrinsic HSG polysilicon spots, 13a, second silicon oxide region, 12b, is thicker then first silicon oxide region, 13b, also consuming a thickness of doped polysilicon layer, 12a, greater then the thickness of the intrinsic HSG polysilicon spot, consumed in the creation of first silicon oxide region, 13b. This is shown schematically in FIG. 4. Another embodiment of this invention is to only convert a portion of the intrinsic HSG polysilicon spots, 13a, to a silicon oxide region, 13b. This oxidation procedure will result in a thinner silicon oxide region, 12b, then observed with the previous embodiment, however still resulting in some consumption of doped polysilicon layer, exposed between intrinsic HSG polysilicon spots, and thus ultimately allowing a saw-toothed polysilicon storage node electrode to be obtained.

Figure 5:
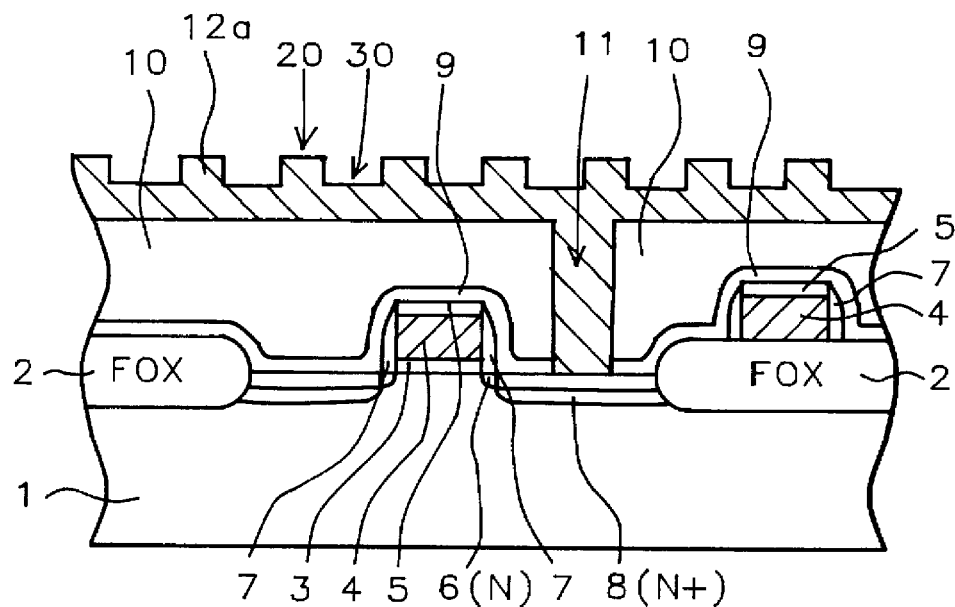
Figure 6:
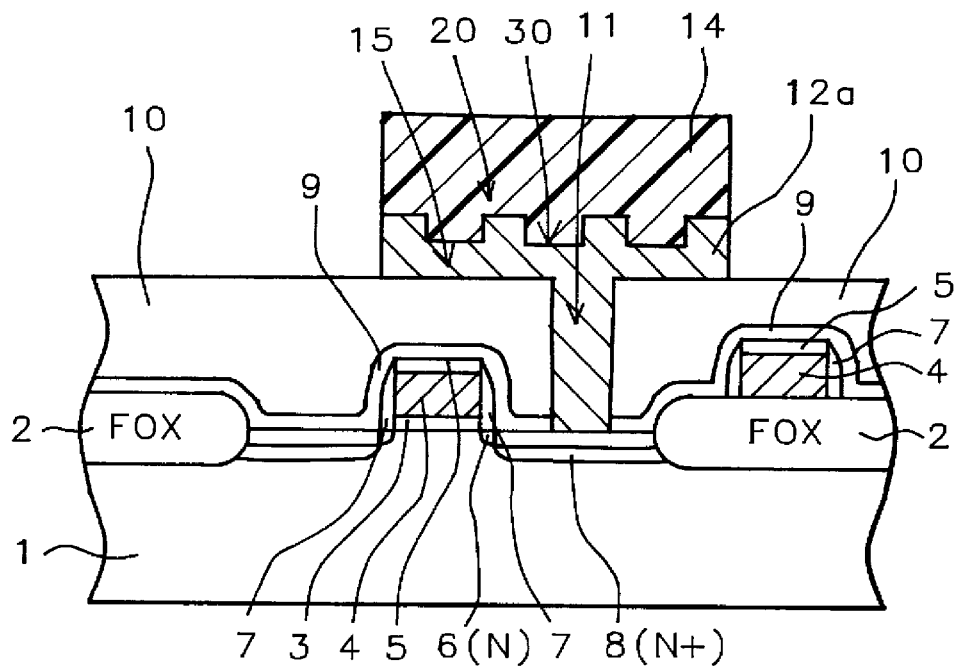

Removal of second silicon oxide region, 12b, and of first silicon oxide region, 13b, is next addressed via use of a dilute hydrofluoric acid solution. The resulting saw-tooth topography, of the doped polysilicon layer, 12a, is shown schematically in FIG. 5. The difference in height between surface, 20, of raised polysilicon features, in which first silicon oxide region, 13b, was removed, and that of surface, 30, of lower polysilicon features, created by the oxidation of doped polysilicon layer, 12a, and removal of second silicon oxide region, 12b, is between about 400 to 2000 Angstroms. The difference in height is directly proportional to the increase in the surface area of the polysilicon storage node electrode. Doped polysilicon layer, 12a, with the saw-toothed topography is next patterned, using photoresist shape, 14, and an anisotropic, RIE procedure, using Cl$_2$ as an etchant, to create polysilicon storage node electrode, 15, schematically shown in FIG. 6. Photoresist shape, 14, is removed using plasma oxygen ashing and careful wet cleans.

Figure 7:
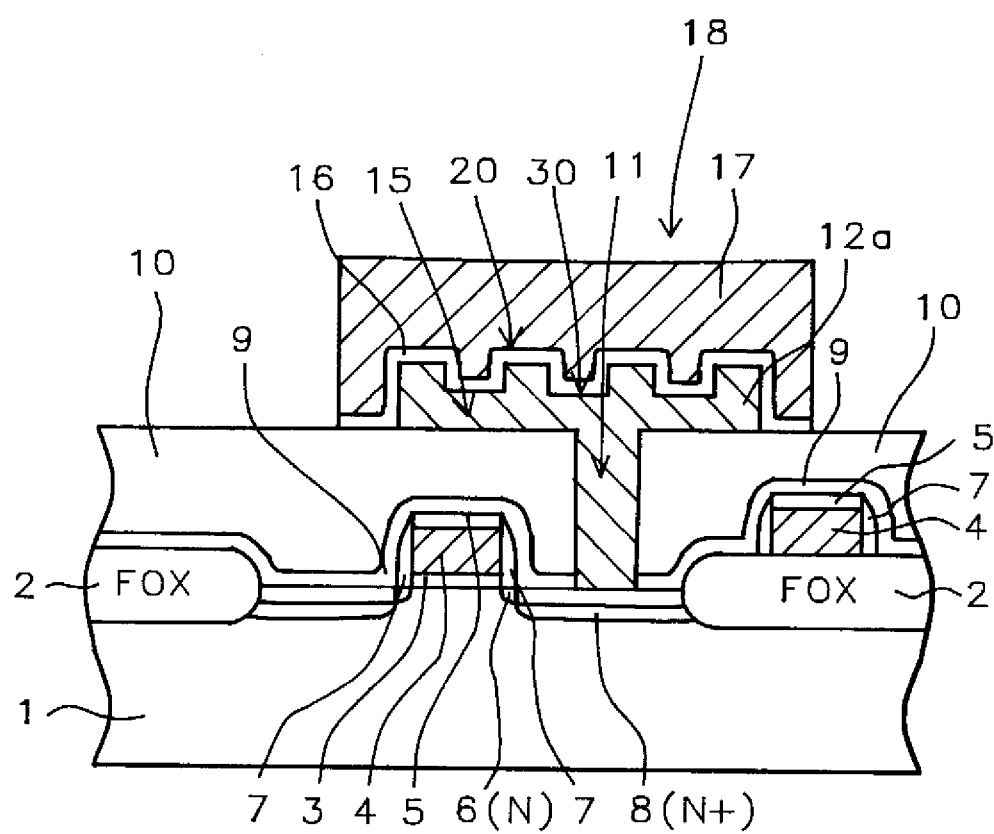

FIG. 7, schematically shows the completion of the STC structure. First a dielectric layer, 16, is formed, overlying the polysilicon storage node electrode, 15. Dielectric layer, 16, can be an insulator layer possessing a high dielectric constant, such as Ta$_2$O$_5$, obtained via r.f sputtering techniques, at a thickness between about 10 to 100 Angstroms. Dielectric layer, 16, can also be ONO, (Oxidized-silicon Nitride-silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 500° to 700° C., to a thickness between about 1000 to 2000 Angstroms. Doping of this polysilicon layer is accomplished via an situ doping deposition procedure, by the addition of phosphine, to the silane ambient. Photolithographic and RIE procedures, using Cl$_2$ as an etchant, are next employed to create polysilicon upper electrode, or plate electrode, 17, shown schematically in FIG. 7. Photoresist is again removed via plasma oxygen ashing and careful wet cleans, resulting in STC structure, 18, featuring increased surface area of polysilicon storage node electrode, 15.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a DRAM device, on a semiconductor substrate, comprised of an underlying transistor; with a gate insulator, a gate electrode structure, formed from a first insulator layer, and from a first polysilicon layer, insulator sidewall spacers, formed from a second insulator layer, and source and drain regions, and an overlying STC structure; with a polysilicon storage node electrode, a dielectric layer, and an overlying polysilicon plate electrode, and with the top surface of said polysilicon storage node electrode, exhibiting a saw-toothed topography, comprising the steps of:

depositing a third insulator layer, on said underlying transistor of said DRAM device;

depositing a doped dielectric layer on said third insulator layer;

planarizing said doped dielectric layer;

opening a contact hole, in said doped dielectric layer, and in said third insulator layer, to expose top surface of said source and drain regions, of said underlying transistor;

depositing a doped, second polysilicon layer on top surface of said doped dielectric layer, and on top surface of said source and drain regions, exposed in said contact hole;

depositing intrinsic HSG polysilicon spots on said doped second polysilicon layer;

oxidizing said intrinsic HSG polysilicon spots to form a first silicon oxide region, on the top surface of said doped second polysilicon layer;

oxidizing a top portion of said doped second polysilicon layer, exposed between said intrinsic HSG polysilicon spots, to form a second silicon oxide region, thicker then said first silicon oxide region, overlying lower portions of said doped second polysilicon layer;

removing said first silicon oxide region, exposing top surface of raised portions of said doped second polysilicon layer, and removing said second silicon oxide region, exposing top surface of said lower portions of said doped second polysilicon layer, resulting in a saw-toothed topography, comprised of raised and lower features in said doped second polysilicon layer;

patterning of said doped second polysilicon layer, to create said polysilicon storage node electrode, with said saw-toothed topography;

forming said dielectric layer on said polysilicon storage node electrode;

depositing a third polysilicon layer on said dielectric layer; and patterning of said third polysilicon layer to form said plate electrode, of said STC structure.

2. The method of claim 1, wherein said doped second polysilicon layer is deposited using LPCVD procedures, at a temperature between about 500° to 700° C., to a thickness between about 1000 to 4000 Angstroms, with a N type dopant concentration between about 1E20 to 1E21 atoms/cm$^3$, obtained using in situ doping procedures, via the addition of phosphine or arsine to a silane ambient.

3. The method of claim 1, wherein said intrinsic HSG polysilicon spots are deposited at a temperature between about 500° to 700° C., to a thickness between about 100 to 1000 Angstroms, with a diameter between about 50 to 500 Angstroms.

4. The method of claim 1, wherein the space between said intrinsic HSG polysilicon spots is between about 100 to 1000 Angstroms.

5. The method of claim 1, wherein said first silicon oxide region is grown via thermal oxidation of said intrinsic HSG polysilicon spots, in an oxygen—steam ambient, at a temperature between about 700° to 900° C., to a thickness between about 200 to 1000 Angstroms.

6. The method of claim 1, wherein said second silicon oxide region is grown via thermal oxidation of said doped second polysilicon layer, in an oxygen—steam ambient, at a temperature between about 700° to 900° C., to a thickness between about 300 to 2000 Angstroms.

7. The method of claim 1, wherein said first silicon oxide region, and said second silicon oxide region, are removed via use of wet etching using a dilute hydrofluoric acid solution.

8. The method of claim 1, wherein said saw-toothed topography, of said doped second polysilicon layer, is comprised of raised portions, and lower portions of said doped second polysilicon layer, with the difference in height between said raised portions, and said lower portions, of said doped second polysilicon layer, between about 400 to 2000 Angstroms.

9. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

10. The method of claim 1, wherein said third polysilicon layer, used for creation of said polysilicon plate electrode of said STC structure, is deposited using LPCVD procedures, at a temperature between about 500° to 700°C., to a thickness between about 1000 to 2000 Angstroms.

11. A method of fabricating a stacked capacitor structure, (STC), for a DRAM device, in which the surface area of the polysilicon storage node electrode is increased via use of a polysilicon storage node electrode, exhibiting a saw-tooth topography, obtained via oxidation of doped and intrinsic polysilicon regions, comprising the steps of:

depositing a first insulator layer on an underlying transistor structure, of said DRAM device;

depositing a doped dielectric layer on said first insulator layer;

planarizing said doped dielectric layer;

opening a contact hole in said doped dielectric layer, and in said first insulator layer, to expose top surface of said underlying transistor region;

depositing a doped, first polysilicon layer on top surface of said doped dielectric layer, and on said top surface of said underlying transistor region, exposed in said contact hole;

depositing intrinsic HSG polysilicon spots on said doped, first polysilicon layer;

oxidizing said intrinsic HSG polysilicon spots, to form a thin silicon oxide region on the top surface of a first region of said doped, first polysilicon layer;

oxidizing a top portion, of a second region of said doped, first polysilicon layer, exposed between said intrinsic HSG polysilicon spots, to form a thick silicon oxide region, on the top surface, of a bottom portion of a second region of said doped, first polysilicon layer;

removing said thin silicon oxide region, exposing the top surface of said first region of said doped, first polysilicon layer, and removing said thick silicon oxide region, exposing the top surface, of a bottom portion of said doped, first polysilicon layer, in said second region, resulting in a saw-toothed topography, comprised of raised doped, first polysilicon features in said first region of said doped, first polysilicon layer, and lower doped, first polysilicon features in said second region of said doped, first polysilicon layer;

patterning of said doped, first polysilicon layer to create said polysilicon storage node electrode, with said saw-toothed topography;

forming a dielectric layer on saw-toothed polysilicon storage node electrode;

depositing a second polysilicon layer on said dielectric layer; and patterning of said second polysilicon layer to form polysilicon plate electrode, of said STC structure.

12. The method of claim 11, wherein said doped, first polysilicon layer is obtained via LPCVD procedures, at a temperature between about 500° to 700° C., to a thickness between about 1000 to 4000 Angstroms, with an N type dopant concentration between about 1E20 to 1E21 atoms/cm$^3$, obtained using an in situ doping procedure via the addition of either phosphine or arsine to a silane ambient.

13. The method of claim 11, wherein said intrinsic HSG polysilicon spots are deposited at a temperature between about 500° to 700° C., to a thickness between about 100 to 1000 Angstroms, with a diameter between about 50 to 500 Angstroms.

14. The method of claim 11, wherein the space between said intrinsic HSG polysilicon spots is between about 100 to 1000 Angstroms.

15. The method of claim 11, wherein said thin silicon oxide region, located on the top surface, of a first region of said doped, first polysilicon layer, is grown via thermal oxidation of said intrinsic HSG polysilicon spots, in an oxygen—steam ambient, at a temperature between about 700° to 900° C., to a thickness between about 200 to 1000 Angstroms.

16. The method of claim 11, wherein said thick silicon oxide region, located on the top surface, of a bottom portion of a second region of said doped, first polysilicon layer, is grown via thermal oxidation of said second region, of said doped, first polysilicon layer, in an oxygen—steam ambient, at a temperature between about 700° to 900° C., to a thickness between about 300 to 2000 Angstroms.

17. The method of claim 11, wherein said thin silicon region, and said thick silicon oxide region, are removed via use of a dilute hydrofluoric acid solution.

18. The method of claim 11, wherein said saw-toothed topography of said doped, first polysilicon layer is comprised of raised, doped, first polysilicon features, in a first region of said doped, first polysilicon layer, and lower, doped, first polysilicon features, in a second region of said doped, first polysilicon layer, with the difference in height between said raised polysilicon features, and said lower polysilicon features, between about 400 to 2000 Angstroms.

19. The method of claim 11, wherein said dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

20. The method of claim 11, wherein said second polysilicon layer is deposited using LPCVD procedures, at a temperature between about 500° to 700° C., to a thickness between about 1000 to 2000 Angstroms.

21. The method of claim 11, wherein said polysilicon plate electrode is created via RIE of said second polysilicon layer, using $Cl_2$ as an etchant.

\* \* \* \* \*